(12) United States Patent
Lim et al.

(10) Patent No.: US 7,714,418 B2
(45) Date of Patent: May 11, 2010

(54) LEADFRAME PANEL

(75) Inventors: Peng Soon Lim, Melaka (MY); Terh Kuen Yii, Melaka (MY); Mohd Sabri Bin Mohamad Zin, Melaka (MY); Ken Pham, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 433 days.

(21) Appl. No.: 11/781,788

(22) Filed: Jul. 23, 2007

(65) Prior Publication Data
US 2009/0026590 A1 Jan. 29, 2009

(51) Int. Cl.
*H01L 23/495* (2006.01)
(52) U.S. Cl. .................. 257/670; 257/666; 257/672; 257/676; 257/E23.031; 257/E23.042; 257/E23.043
(58) Field of Classification Search .................. 257/666, 257/670, 672, 676, E23.031, E23.042, E23.043
See application file for complete search history.

(56) References Cited

U.S. PATENT DOCUMENTS

| | | | |
|---|---|---|---|
| 5,977,613 A | 11/1999 | Takata et al. | |
| 6,130,473 A * | 10/2000 | Mostafazadeh et al. | 257/666 |
| 6,750,546 B1 * | 6/2004 | Villanueva et al. | 257/778 |
| 6,777,788 B1 * | 8/2004 | Wan et al. | 257/670 |
| 6,924,549 B2 | 8/2005 | Nose et al. | |
| RE39,854 E | 9/2007 | Mostafazadeh et al. | |
| 2002/0038714 A1 * | 4/2002 | Glenn | 174/52.2 |
| 2002/0079561 A1 * | 6/2002 | Yasunaga et al. | 257/670 |
| 2003/0178748 A1 * | 9/2003 | Bolken et al. | 264/272.17 |
| 2004/0157372 A1 | 8/2004 | Manatad | |
| 2004/0232541 A1 | 11/2004 | Son et al. | |
| 2007/0075409 A1 | 4/2007 | Letterman et al. | |
| 2007/0170600 A1 * | 7/2007 | Nishimura et al. | 257/784 |
| 2008/0265384 A1 | 10/2008 | Dirks | |

FOREIGN PATENT DOCUMENTS

| | | |
|---|---|---|
| EP | 0646961 A2 | 4/1995 |
| WO | WO 2006/090304 A1 | 8/2006 |

OTHER PUBLICATIONS

Annotated Drawings (produced by Examiner using cited references drawings).*
Annotated Drawings (produced by Examiner using cited references drawings) No Date.*
U.S. Appl. No. 11/754,070, filed May 25, 2007.
U.S. Appl. No. 10/831,537, filed Apr. 22, 2004.
U.S. Appl. No. 11/552,879, filed Oct. 25, 2006.
Amkor SOIC/SSOP Package Data Sheet from www.amkor.com, revised date Dec. 2005.

* cited by examiner

*Primary Examiner*—Eugene Lee
*Assistant Examiner*—Peniel M Gumedzoe
(74) *Attorney, Agent, or Firm*—Beyer Law Group LLP

(57) ABSTRACT

An improved leadframe panel suitable for use in packaging IC dice is described. The described leadframe panel is configured such that the amount of leadframe material that is removed during singulation of the leadframe panel is reduced.

20 Claims, 4 Drawing Sheets

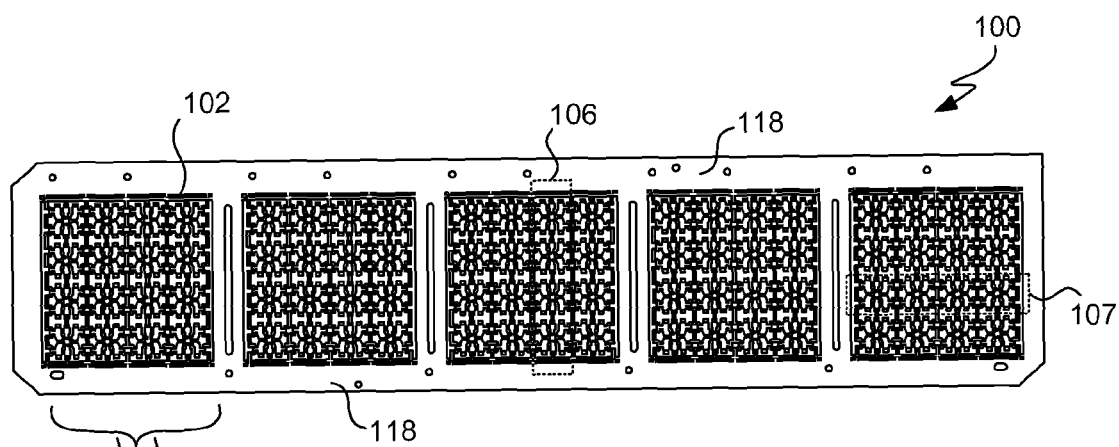
FIG. 1A
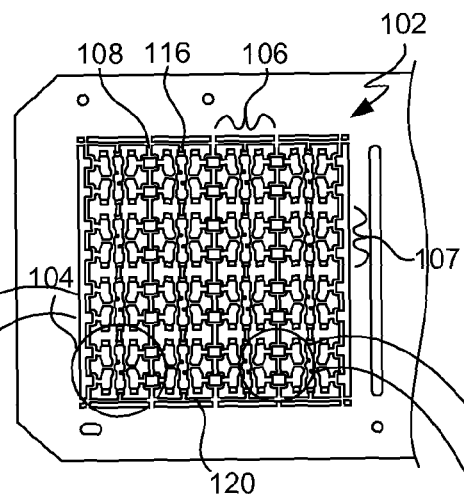
FIG. 1B
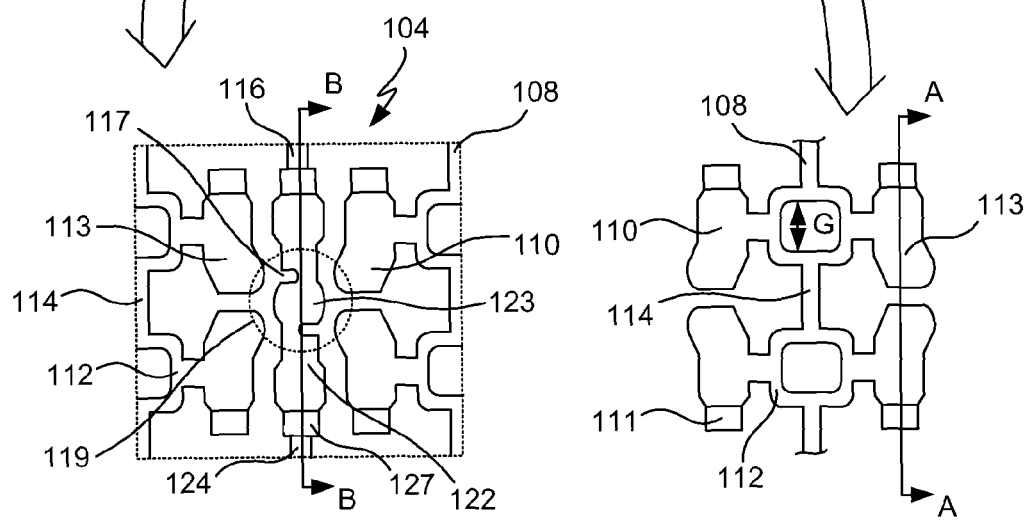
FIG. 1C   FIG. 1D

LEADFRAME PANEL

TECHNICAL FIELD

The present invention relates generally to the packaging of integrated circuits (ICs). More particularly, a leadframe panel suitable for use in packaging IC dice is described that enables a reduction in the amount of leadframe material removed during singulation of the leadframe panel.

BACKGROUND OF THE INVENTION

Conventionally, the singulation of leadframe panel device areas is accomplished via known techniques such as sawing. Often gang-cutting saws are used that employ a plurality of saw blades in parallel such that relatively few saw passes are required to singulate the device areas of the leadframe panel. The process of singulation, and more particularly the process of sawing, produces stresses on leadframe components and associated bonds that may damage the components and associated bonds.

Often the tie bars that interconnect the device areas of the leadframe panel are etched or otherwise thinned such that the amount of leadframe material removed during singulation is reduced. This reduces the stresses on the leadframe components and associated bonds and also extends saw blade life. However, there are continuing efforts to develop more efficient methods of singulation and leadframe panel configurations that enable more efficient singulation while still meeting or improving on other packaging requirements.

SUMMARY OF THE INVENTION

In one embodiment, a leadframe panel suitable for use in packaging integrated circuit dice is described that defines at least one two-dimensional array of device areas arranged in rows and columns. The leadframe panel includes a plurality of tie bars, each tie bar extending between an associated pair of adjacent columns of device areas. Each tie bar is configured to carry a multiplicity of leadframe components, including a plurality of contacts for each adjacent device area. The leadframe panel also includes a plurality of contact strings that extend substantially in parallel with the tie bars such that each contact string passes through an associated column of device areas. Each contact string includes at least one contact for each device area that the contact string passes through. The leadframe panel is arranged such that the contact strings are carried independent of the tie bars, and such that each column of device areas has at least one associated tie bar and at least one associated contact string. In this manner, the leadframe panel is arranged such that all of the leadframe components in each device area in a column of devices areas are carried only by the at least one contact string or the at last one tie bar associated with the column.

In another embodiment, a leadframe panel suitable for use in packaging integrated circuit dice is described that defines at least one two-dimensional array of device areas arranged in rows and columns. The leadframe panel includes a plurality of tie bar structures, each tie bar structure extending between an associated pair of adjacent rows or columns of device areas. Each tie bar structure carries a multiplicity of leadframe components, including a plurality of contacts for each adjacent device area. Each tie bar structure includes a plurality of distinct tie bar segments arranged in a line. Each tie bar segment is separated from an adjacent tie bar segment in the line by a gap. Each tie bar structure further includes a plurality of tie bar links. Each tie bar link connects two adjacent tie bar segments such that the tie bar link does not extend into the gap between the tie bar segments. Each line of tie bar segments is sized and configured such that the tie bar segments are removed during a singulation process by cutting along the line.

In yet another embodiment, an integrated circuit (IC) package is described that includes a semiconductor integrated circuit die. The die has an active surface and a back surface. The active surface has a plurality of bond pads. The back surface is opposite the active surface. The IC package also includes a plurality of contacts, including a first set of contacts and a second set of contacts. The first set of contacts each include two bottom contact surfaces located at opposing first and second sides of the package. The two bottom contact surfaces are electrically connected with one another, but physically isolated from one another, and coplanar with a bottom surface of the package. Each contact of the first set of contacts also includes at least one solder pad surface that is opposite the contact surfaces. The second set of contacts each include a contact surface that is located at one of the first or second sides of the package. The contact surface is also coplanar with the bottom surface of the package. Each contact of the second set of contacts also includes a solder pad surface that is opposite the contact surface. Each contact of the second set of contacts further includes a tie bar link. Portions of each tie bar link are exposed on one of the opposing third or fourth sides of the package. The IC package includes at least one contact from the first set of contacts and at least one contact from the second set of contacts. The IC package further includes solder joints that electrically connect the bond pads on the die to associated solder pad surfaces on the contacts. The IC package also includes molding material that encapsulates portions of the die, solder joints and leadframe components including the contacts while leaving bottom contact surfaces of the contacts exposed on the bottom surface of the package.

BRIEF DESCRIPTION OF THE DRAWINGS

For a better understanding of the invention, reference should be made to the following detailed description taken in conjunction with the accompanying drawings, in which:

FIG. 1A illustrates a diagrammatic top view of a leadframe panel suitable for use in packaging integrated circuits in accordance with a particular embodiment of the present invention;

FIGS. 1B-1D illustrate successively more detailed views of selected elements of the leadframe panel of FIG. 1A;

Like reference numerals refer to corresponding parts throughout the drawings.

DETAILED DESCRIPTION OF THE DRAWINGS

Figure 2A:
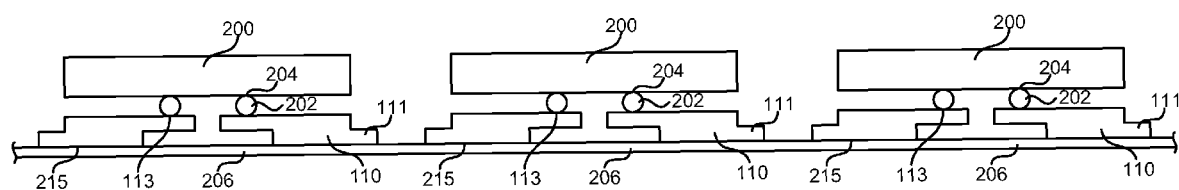
FIGS. 2A and 2B illustrate diagrammatic side views taken along multiple cross-sections A-A and B-B of FIG. 1C, respectively.

The present invention relates generally to the packaging of integrated circuits (ICs). More particularly, a leadframe panel suitable for use in packaging IC dice is described that enables a reduction in the amount of leadframe material removed during singulation of the leadframe panel.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Particular embodiments of the present invention provide for a leadframe panel suitable for use in packaging IC dice that is configured such that the amount of leadframe material that is removed during singulation of the leadframe panel is significantly reduced. This reduction in leadframe material has notable consequences. First, the stresses imposed on the leadframe panel, and particularly the contacts and associated bonds, during singulation of the leadframe panel are substantially reduced. Second, saw blade life is appreciably extended. These and other features of the present invention will be demonstrated in the following description.

Particular embodiments of the present invention will now be described with reference to FIGS. 1-4. FIG. 1A illustrates a diagrammatic top view of a leadframe panel 100 arranged in the form of a strip. The leadframe panel 100 can be configured as a metallic (or other conductive) structure having a number of two-dimensional arrays 102 of device areas 104 arranged in rows 107 and columns 106. As illustrated in the successively more detailed FIGS. 1B-D, each column 106 includes a plurality of immediately adjacent device areas 104, each of which is configured for use in a single IC package. In the illustrated embodiment, each two-dimensional array 102 includes four columns 106, with each column including four device areas 104. Thus, the illustrated embodiment has four rows 107 of device areas 104 in each two-dimensional array 102. However, it should be appreciated that both the number of columns 106 and the number of device areas 104 in each column may vary widely.

Tie bar structures (hereinafter also "tie bars") 108 connect immediately adjacent columns 106 of device areas 104. In the illustrated embodiment, the tie bars 108 extend parallel to the columns 106 of device areas 104, and there are no tie bars extending between adjacent rows 107 of device areas perpendicular to the columns 106. Each tie bar 108 carries a plurality of contacts 110 for each device area 104 adjacent to the tie bar. By way of example, in the illustrated embodiment, each tie bar 108 carries two contacts 110 for each adjacent device area 104. In other embodiments, each tie bar 108 may carry more or less than two contacts 110 for each adjacent device area 104. The number of contacts 110 carried by a particular tie bar 108 for different device areas 104 may be varied as well. For example, a tie bar 108 may carry three contacts 110 for each device area 104 on one side of the tie bar and four contacts for each device area on the other side of the tie bar. As will be appreciated by those familiar with the art, a wide variety of other contact configurations can be used as well.

In the first described embodiment, the leadframe panel 100 is configured such that dice may be flip-chip mounted onto associated device areas 104. Therefore, each contact 110 includes a conductive solder pad surface 113 that is parallel with the top surface of the leadframe panel 100. As illustrated in FIG. 2A, which illustrates a cross-section of multiple device areas 104 each taken along line A-A of FIG. 1D, the solder pad surface 113 is configured to receive an associated solder ball (hereinafter also solder bump or solder joint) 202 used to physically and electrically connect the contact 110 to an associated bond pad 204 on the active surface of an associated die 200. Each contact 110 also includes a conductive contact surface 215 that is parallel with the bottom surface of the leadframe panel 100. The contact surface 215 is configured to facilitate physical and electrical connection of the contact 110 to an associated contact surface on an external device such as a substrate, a printed circuit board (PCB) or another device after packaging.

Although the illustrated embodiment utilizes flip-chip mounting to electrically connect the dice to the lead frame, it should be appreciated that the device areas can readily be configured to facilitate other die to contact electrical connection techniques such as wire bonding.

In the illustrated embodiment the peripheral portions 111 of the contacts 110 are etched or otherwise thinned relative to the top surface of the leadframe panel 100. Furthermore, the inner portions of the contacts 110 are etched or otherwise thinned or recessed relative to the bottom surface of the leadframe panel 100. By way of example, the peripheral portions 111 and inner portions may be half-etched relative to the top surface and bottom surface, respectively, of the leadframe panel 100.

In the illustrated embodiment, each tie bar 108 is segmented into tie bar segments 114. The tie bar segments 114 associated with a single tie bar 108 are arranged in a line. Each tie bar segment 114 is separated from immediately adjacent tie bar segments by a gap G. As best illustrated in FIGS. 1C and 1D, at least one tie bar link 112 connects any two adjacent tie bar segments 114. Notably, in the illustrated embodiment, the tie bar links 112 do not extend into the gaps in between the tie bar segments 114. Each contact 110 carried by an associated tie bar 108 is connected with the tie bar by means of an associated tie bar link 112. In the illustrated embodiment, each tie bar link 112 has a characteristic "fish tail" shape. However, it should be noted that a wide variety of other tie bar link geometries may be suitable as well. Additionally, in the described embodiment, the tie bars 108, including both the tie bar links 112 and tie bar segments 114, are recessed relative to the bottom surface of the leadframe panel 100. By way of example, the tie bars 108 may be half-etched relative to the bottom surface of the leadframe panel 100 so that the bottom surfaces of the tie bars 108 are raised relative to the bottom surface of the lead frame panel 100.

In the illustrated embodiment, each tie bar 108 extends from one side rail 118 of the leadframe panel 100 to the opposite side rail. The side rails 118 provide a rigid frame from which the tie bars 108 are supported. Additionally, a horizontal tie bar 120 extends parallel to each of the side rails 118 and intersects each of the associated tie bars 108. In another embodiment, the tie bars 108 may intersect the horizontal tie bars 120 and not the side rails 118. In still other embodiments, the horizontal tie bar 120 may not be present at all. Again, it should be noted that in the illustrated embodiment, no tie bars extend between rows 107 of device areas perpendicular to the columns 106. Specifically, it should be noted that contacts 110 of adjacent device areas 104 within a column 106 are not connected via tie bars.

In the illustrated embodiment, each column 106 of device areas 104 also includes at least one contact string 116. Each contact string 116 extends parallel to the columns 106 of device areas. Notably, the contact strings 116 do not contact the tie bars 108 or any other leadframe components within the device areas 104. In the illustrated embodiment, the contact strings 116 are carried only by the horizontal tie bars 120. In other embodiments, the contact strings may extend to the side rails 118.

FIG. 1C illustrates a single device area 104 and a portion of an associated contact string 116. The portion of the contact string 116 within each device area 104 includes at least one contact 122. Each contact 122 is linked to the other contacts 122 in adjacent device areas via contact bridges 124. To reduce the stresses on each contact string 116, the contacts 122 may be shaped and otherwise configured so as to achieve a spring effect. By way of example, in the illustrated embodiment, each contact 122 includes a center portion having notches 117 on either side of the center portion so as to produce an "s"-shaped portion 119 that is able to absorb stresses imposed in the contact string 116.

Each contact 122 includes a conductive solder pad surface 123 that is parallel with the top surface of the leadframe panel 100. The solder pad surface 123 is configured to receive one or more solder bumps 202 used to physically and electrically connect the contact 122 to one or more associated bond pads 204 on the active surface of an associated die 200. In the illustrated embodiment, a single solder bump 202 is positioned at the center of the solder pad surface 123. In other embodiments, solder bumps 202 may be positioned at more peripheral portions of the contact 122. By way of example, a solder bump 202 may be positioned at either side of the center portion of the solder pad surface 123.

Figure 2B:
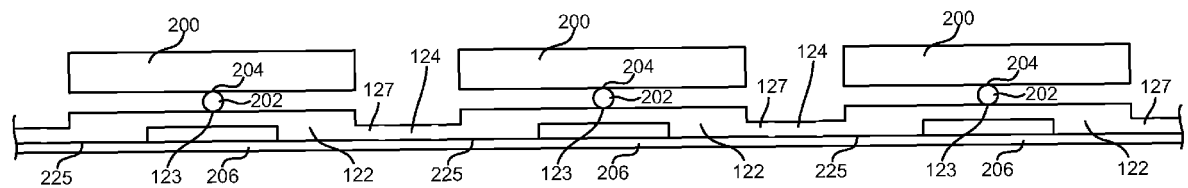

As best illustrated in FIG. 2B, which illustrates a cross-section of multiple device areas 104 each taken along line B-B of FIG. C, each contact 122 also includes at least one contact surface 225 parallel with the bottom surface of the leadframe panel 100. In the illustrated embodiment, the portion of the contact string 116 within each device area 104 is etched in a middle region relative to the bottom surface of the leadframe panel 100 such that the contact 122 includes two contact surfaces 225 parallel with the bottom surface of the leadframe panel 100. By way of example, the middle region of the contact 122 may be half-etched relative to the bottom surface of the leadframe panel 100. Additionally, in the illustrated embodiment the peripheral portions 127 of the contacts 122 and the contact bridges 124 are recessed relative to the top surface of the leadframe panel 100. By way of example, the peripheral portions 127 and contact bridges 124 may be recessed by half-etching these structures relative to the top surface of the leadframe panel 100.

It should be noted that, in the aforementioned embodiments, all of the contacts 110 and 122 are carried by either a contact string 116 or by a tie bar 108 via a tie bar link 112.

The aforementioned features of the leadframe panel 100 may be formed with any suitable means. By way of example, the features (e.g., tie bars 108, contacts 110 and 122, and associated features) may be formed by stamping or etching a metallic sheet formed from a suitable conductive material.

As illustrated in FIGS. 2A and 2B, in particular embodiments a tape 206 is adhered to the bottom surface of the leadframe panel 100. The tape 206 provides support for the features of the leadframe panel 100 and is also used advantageously in the encapsulation of the leadframe panel 100 with molding material.

Figure 3:
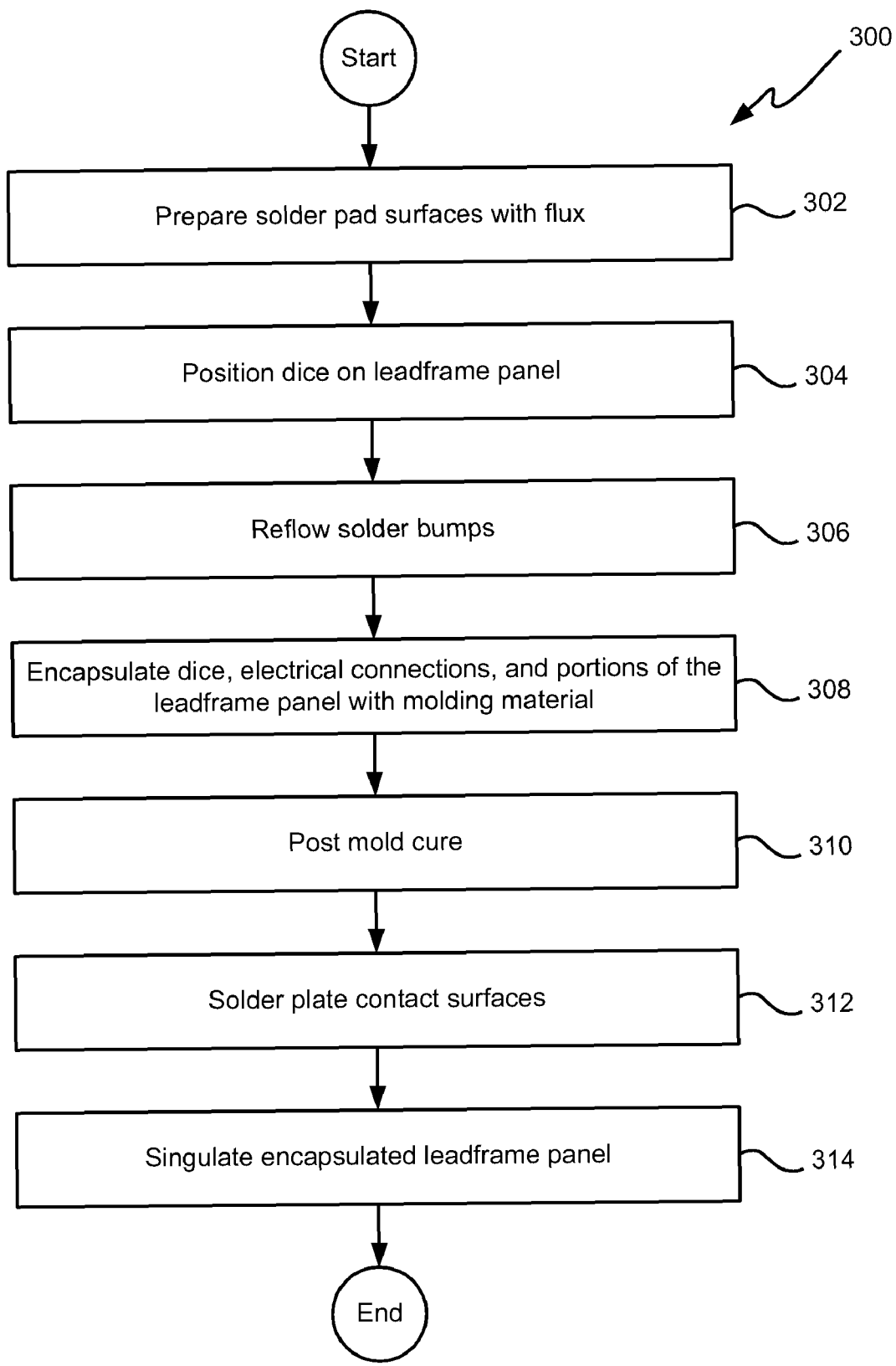
FIG. 3 is a flow chart illustrating a process of packaging integrated circuit dice utilizing the leadframe panel of FIG. 1A in accordance of a particular embodiment of the present invention.

With reference to FIG. 3, a process 300 of packaging semiconductor IC dice utilizing the leadframe panel 100 of FIGS. 1A-1D will be described. First, the solder pad surfaces 113 and 123 may be prepared 302 with flux. Next, a plurality of solder bumped dice are positioned 304 on the leadframe panel 100. The leadframe panel 100 and dice are then placed in a reflow oven for reflow 306 of the solder bumps thereby physically and electrically connecting the dice to associated device areas 104.

Portions of the populated leadframe panel 100 may then be encapsulated 308 with a conventional molding material. The molding material is generally a non-conductive plastic having a low coefficient of thermal expansion. In one embodiment, each two-dimensional array 102 is encapsulated substantially simultaneously. In this embodiment, the dice, electrical connections, contacts 110 and 122, tie bar links 112, tie bar segments 114 and contact bridges 124 may all be encapsulated with molding material excluding those portions that are parallel with the bottom surface of the leadframe panel 100 and in contact with the tape 206 (e.g., the contact surfaces 215 and 225). In this way, the contact surfaces 215 and 225 are left exposed on the bottom surface of the encapsulated leadframe panel 100. In a preferred embodiment, a film assisted molding FAM system may be used to encapsulate the populated leadframe panel 100. By way of example, in one embodiment a Boschman film assisted molding system is used to encapsulate the populated leadframe panel 100.

It should be appreciated, that in other embodiments smaller or larger portions of the leadframe panel 100 may be encapsulated substantially simultaneously. By way of example, a mold may be equipped with multiple mold cavities such that each two-dimensional array 102 may be encapsulated substantially simultaneously with the other arrays 102 of the leadframe panel 100. In this way, all of the device areas 104 of an entire leadframe panel 100 may be encapsulated substantially simultaneously.

After encapsulation, the molding material is subjected to a post mold cure 310. Following the post mold cure 310, bottom contact surfaces 215 and 225 may be solder plated 312. Solder plating is generally performed to facilitate electrical connection to contacts on an external device such as a PCB.

Next, the encapsulated leadframe panel 100 may be singulated 314 to produce individual IC packages. The encapsulated leadframe panel 100 may be singulated by any suitable means (e.g., sawing, laser cutting or punching). It should be appreciated that the described arrangement of the leadframe panel 100 allows for the use of efficient singulation methods. In one representative embodiment, the encapsulated leadframe panel 100 is singulated by means of single pass sawing or gang-cutting. Gang-cutting involves the use of a plurality of parallel saw blades to saw the leadframe panel 100 simultaneously. In this way, a plurality of encapsulated columns 106 may be singulated from each other substantially simultaneously. Subsequently, another pass of the gang-cutter may be used to singulate the individual encapsulated device areas (packages) of an associated column 106 from one another (It should be appreciated that in another embodiment the order of the saw passes may be reversed).

Notably, the described leadframe panel 100 enables a significant reduction in the amount of leadframe material removed during singulation of the leadframe panel. More particularly, when singulating the columns 106, the amount of leadframe material that needs to be sawed through is reduced since the saw blades need only cut through the tie bar segments 114. However, in order to conform with tolerances, part of the tie bar links 112 may be removed as well. By way of example, for tie bar segments 114 having widths of approximately 0.15 mm, a saw blade may be used having a width of approximately 0.25 mm. Thus, by decreasing the lengths of the tie bar segments and correspondingly increasing the gap G between the tie bar segments, the amount of leadframe material removed during singulation may be significantly reduced.

Moreover, in the singulation cuts that are made between adjacent rows 107 of device areas 104, the only leadframe material that is necessary to remove is the small segment of leadframe that constitutes the contact bridges 124. Thus, the use of contact bridges 124 between adjacent rows 107, as opposed to entire tie bars, also enables a significant reduction in the amount of leadframe material removed during singulation, generally more so than does the use of segmented tie bars 108. Again, to conform with tolerances, some of the peripheral portions 111 and 127 of the contacts 110 and 122, respectively, may be removed during singulation as well. Additionally, as mentioned above, bottom surfaces of the tie bar segments 114 and tie bar links 112 are also etched or otherwise recessed or thinned. Recessing these bottom surfaces, as well as that of the peripheral portions 111 and 127 of the contacts further reduces the amount of leadframe material removed during singulation of the leadframe panel 100.

The described leadframe panel 100 and packaging process enables package lengths and widths of approximately 2.0 mm (or smaller). This is due, in part, to the reduction in stress achieved during singulation as a result of reducing the amount of leadframe material removed during singulation.

Figure 4A:
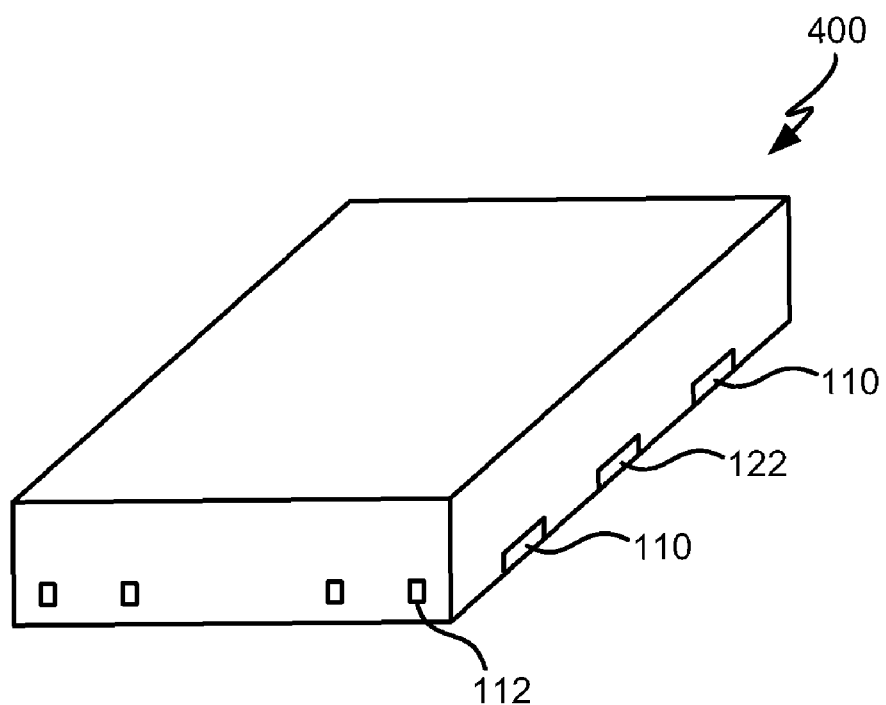
FIGS. 4A and 4B illustrate diagrammatic perspective and bottom views, respectively, of an IC package in accordance with a particular embodiment of the present invention.
Figure 4B:
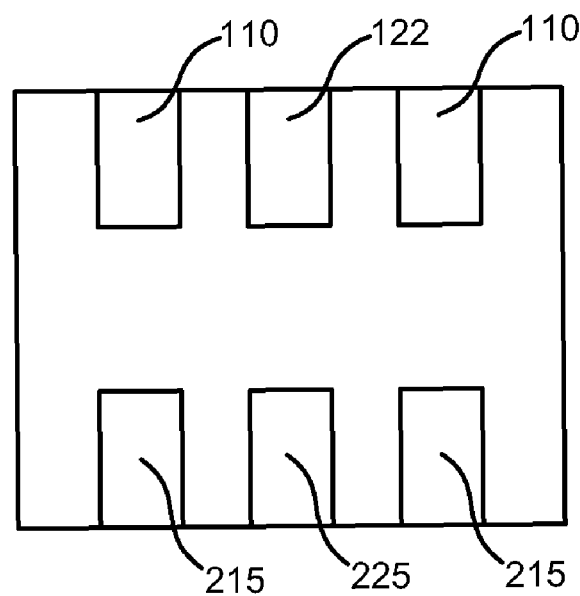

FIGS. 4A and 4B illustrate perspective and bottom views of a package 400 in accordance with particular embodiments of the present invention. The package 400 is produced utilizing particular embodiments of a device area 104 of the leadframe panel 100 described above. As can be seen, the resultant package 400 resembles an LLP package. In particular, the bottom surface of the illustrated package 400 resembles a conventional LLP package having six contact surfaces.

The tie bar links 112 provide locking features that secure the respective contacts 110 within the package upon encapsulation with a molding material. Etched features in the contacts 110 and 122 may also serve to secure the contacts within the package.

It will be appreciated by those skilled in the art that, although a specific leadframe panel 100 has been described and illustrated, variations exist that lie within the spirit and scope of the present invention. Additionally, although described with references to top and bottom surfaces of the leadframe panel 100, it should be appreciated that this context is intended solely for use in describing the structure and in no way defines or limits the orientation of the leadframe for subsequent attachment to an external device.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

By way of example, although the leadframe panel 100 was described as having both segmented tie bars 108 and contact strings 116 so as to minimize the leadframe material removed during singulation, it should be appreciated that in other embodiments, a leadframe panel in accordance with particular embodiments may not include both of these features. By way of example, a leadframe panel may include contact strings 116 and conventional solid tie bars between adjacent columns 106. Conversely, in other embodiments, a leadframe panel may include segmented tie bars 108, and not contact strings 116. The segmented tie bars 108 can also be used in leadframes that have a two-dimensional matrix of tie bars (i.e., in arrays that have tie bars extending between adjacent rows in addition to adjacent columns). Additionally, in still other embodiments, each two-dimensional array 102 may be subdivided into two or more subarrays. In these embodiments, the columns 106 within adjacent subarrays may be separated by tie bars extending along the boundary of the subarray perpendicular to the columns 106 of device areas 104.

In other embodiments, each column 106 of device areas 104 may include multiple contact strings 116. In these embodiments, each contact string 116 may be physically isolated from the other contact strings within the associated column 106.

In various other embodiments, the tie bars links 112 and/or strings similar to contact string 116 may be configured to carry die attach pads or other leadframe components rather than, or in addition to, contacts 110 and 122. These embodiments may be beneficial in applications in which dice are wire bonded to the surrounding contacts.

Additionally, in the illustrated embodiment, the inner portions of the contacts 110 angle towards the center of the associated device area 104. The inner portions of the contacts 110 may be angled in this way so as to better align with bond pads 204 on an associated die 200. More specifically, the inner portions of the contacts 110 and the contact 122 are arranged so as to match the pitch and layout of bond pads on the associated die. However, the shapes and angles of the contacts 110 and 122 should not be considered as limited by the illustrations as other shapes and arrangements may be appropriate for other dice and lie within the spirit and scope of the present invention.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A leadframe panel that defines at least one two-dimensional array of device areas arranged in rows and columns, the leadframe panel comprising:

a plurality of tie bars, each tie bar extending between an associated pair of adjacent columns of device areas and carrying a multiplicity of leadframe components, including a plurality of contacts for each adjacent device area in the associated pair of adjacent columns; and a plurality of contact strings that extend substantially in parallel with the tie bars such that each contact string passes through an associated column of device areas, each contact string including at least one contact for each device area that the contact string passes through, and wherein each column of device areas has at least one associated tie bar and at least one associated contact string, none of the at least one associated tie bar being connected to any of the at least one associated contact string except at the ends of the column, whereby all of the leadframe components in each device area in a column of devices areas are carried only by the at least one contact string or the at least one tie bar associated with the column.

2. A leadframe panel as recited in claim 1, wherein the region of each contact string within each device area includes two contact surfaces that are substantially co-planar with a bottom surface of the leadframe panel, and a solder pad surface that is substantially co-planar with a top surface of the leadframe that is opposite the bottom surface of the leadframe panel, wherein the solder pad surface is offset laterally from the contact surfaces such that the solder pad surface does not overlie either of the contact surfaces.

3. A leadframe panel as recited in claim 2, wherein the portion of the contact string below the solder pad surface is recessed relative to the bottom surface of the leadframe panel.

4. A leadframe panel as recited in claim 1, wherein peripheral portions of selected contacts are recessed relative to a top surface of the leadframe panel.

5. A leadframe panel as recited in claim 1, wherein at least portions of the tie bars are recessed relative to a bottom surface of the leadframe panel.

6. A leadframe panel as recited in claim 1, wherein the region of each contact string within each device area includes one or more notches on side surfaces of the contact so as to achieve a spring effect for absorbing stresses in the associated contacts.

7. A leadframe panel as recited in claim 1, further comprising a plurality of dice, each die having an active surface including a plurality of bond pads, each die being physically and electrically connected to an associated device area with solder joints that connect the bond pads on the active surface of the die with solder pad surfaces on associated contacts within an associated device area, and molding material that encapsulates the dice, solder joints and portions of the leadframe panel.

8. A leadframe panel as recited in claim 1, wherein each column of device areas includes a plurality of contact strings, each contact string being carried independent of the tie bars and the other contact strings within the column of device areas.

9. A leadframe panel as recited in claim 1, wherein each contact string includes at least one die attach pad for each device area that the contact string passes through.

10. A leadframe panel as recited in claim 1, wherein a contact string includes only a single contact for each device area that the contact string passes through, the single contact being configured as a die attach pad.

11. A leadframe panel as recited in claim 1, wherein the tie bars are segmented tie bar structures that include a plurality of distinct tie bar segments arranged substantially in a line, each tie bar segment being separated from an adjacent tie bar segment in the line by a gap, each tie bar structure also including a plurality of tie bar links, each tie bar link connecting two adjacent tie bar segments such that the tie bar link does not extend into the gap between the tie bar segments, wherein the leadframe components carried by the tie bar structures are connected only to the tie bar links and not the tie bar segments, and wherein each line of tie bar segments is sized and configured such that the tie bar segments are removed during a singulation process by cutting along the line.

12. A leadframe panel that defines at least one two-dimensional array of device areas arranged in rows and columns, the leadframe panel comprising:
a plurality of tie bar structures, each tie bar structure extending between an associated pair of adjacent rows or columns of device areas and carrying a multiplicity of leadframe components, including a plurality of contacts for each adjacent device area, each tie bar structure including
a plurality of distinct tie bar segments arranged substantially in a line, each tie bar segment being separated from an adjacent tie bar segment in the line by a gap, and
a plurality of tie bar links, each tie bar link connecting two adjacent tie bar segments such that the tie bar link does not extend into the gap between the tie bar segments; and
wherein each line of tie bar segments is sized and configured such that the tie bar segments are removed during a singulation process by cutting along the line.

13. A leadframe panel as recited in claim 12, wherein the tie bar links are sized and configured such that the tie bar links are substantially retained during the singulation process.

14. A leadframe panel as recited in claim 12, wherein the leadframe components carried by the tie bar structures are connected only to the tie bar links and not the tie bar segments.

15. A leadframe panel as recited in claim 12, wherein linearly adjacent tie bar segments are each connected by an associated pair of tie bar links that are located on opposite sides of the associated gap from one another.

16. A leadframe panel as recited in claim 12, wherein the tie bar links and tie bar segments are recessed relative to a bottom surface of the leadframe panel.

17. A leadframe panel as recited in claim 12, wherein each tie bar link includes a first end that connects to one of the associated adjacent tie bar segments, a second end that connects to the other associated adjacent tie bar segment, and a third end that connects to an associated leadframe component.

18. A leadframe panel as recited in claim 12, further comprising a plurality of contact strings that extend substantially in parallel with the tie bar structures such that each contact string passes through an associated column of device areas, each contact string including at least one leadframe component for each device area that the contact string passes through, wherein the contact strings are carried independent of the tie bar structures, and wherein each column of device areas has at least one associated tie bar and at least one associated contact string, whereby all of the leadframe components in each device area in a column of devices areas are carried only by the at least one contact string or the at last one tie bar structure associated with the column.

19. An integrated circuit package, comprising:
a semiconductor integrated circuit die, the die having an active surface and a back surface, the active surface including a plurality of bond pads, the back surface being substantially opposite the active surface;
a plurality of contacts, including a first set of contacts and a second set of contacts,
the first set of contacts each including two bottom contact surfaces located at opposing first and second sides of the package that are electrically connected with one another, physically isolated from one another, and substantially coplanar with a bottom surface of the package, and at least one solder pad surface that is substantially opposite the contact surfaces,
the second set of contacts each including a contact surface that is located at one of the first or second sides of the package and is substantially coplanar with the bottom surface of the package, and a solder pad surface that is substantially opposite the contact surface, each contact of the second set of contacts also including a tie bar link, wherein portions of each tie bar link are exposed on one of opposing third or fourth sides of the package;

wherein the integrated circuit package includes at least one contact from the first set of contacts and at least one contact from the second set of contacts;

solder joints that electrically connect bond pads on the die to associated solder pad surfaces on the contacts; and molding material that encapsulates portions of the die, solder joints and leadframe components including the contacts while leaving bottom contact surfaces of the contacts exposed on the bottom surface of the package.

20. An integrated circuit package as recited in claim 19, wherein the package includes only one contact from the first set of contacts and wherein the solder pad surface of the one contact is laterally offset from the associated bottom contact surfaces of the one contact such that the solder pad surface is positioned adjacent to a center bond pad positioned substantially at a center region of the active surface of the die.

* * * * *